(12) United States Patent
Iwaki

(10) Patent No.: US 8,237,208 B2
(45) Date of Patent: Aug. 7, 2012

(54) SEMICONDUCTOR DEVICE INCLUDING HYDROGEN BARRIER FILM FOR COVERING METAL-INSULATOR-MEAL CAPACITOR AND METHOD OF MANUFACTURING THE SAME

(75) Inventor: Takayuki Iwaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 376 days.

(21) Appl. No.: 12/289,824

(22) Filed: Nov. 5, 2008

(65) Prior Publication Data
US 2009/0134493 A1 May 28, 2009

(30) Foreign Application Priority Data
Nov. 26, 2007 (JP) ................................. 2007-304856

(51) Int. Cl.
*H01L 29/92* (2006.01)
*H01L 21/02* (2006.01)
(52) U.S. Cl. .. 257/306; 257/532; 257/535; 257/E29.343
(58) Field of Classification Search .................. 257/306, 257/532, 535, E29.343
See application file for complete search history.

(56) References Cited

U.S. PATENT DOCUMENTS

| | | | | |
|---|---|---|---|---|
| 5,812,364 A * | 9/1998 | Oku et al. | ...... | 361/312 |
| 6,144,051 A * | 11/2000 | Nishimura et al. | ...... | 257/277 |
| 6,180,971 B1 * | 1/2001 | Maejima | ...... | 257/295 |
| 6,455,882 B1 * | 9/2002 | Nakura | ...... | 257/295 |
| 6,509,593 B2 * | 1/2003 | Inoue et al. | ...... | 257/295 |
| 6,576,526 B2 * | 6/2003 | Kai et al. | ...... | 438/393 |
| 6,777,776 B2 * | 8/2004 | Hieda | ...... | 257/532 |
| 6,891,715 B2 * | 5/2005 | Mikawa et al. | ...... | 361/311 |
| 6,982,455 B2 * | 1/2006 | Hayashi | ...... | 257/310 |
| 6,982,472 B2 * | 1/2006 | Kiyotoshi | ...... | 257/532 |
| 7,242,094 B2 * | 7/2007 | Matsunaga et al. | ...... | 257/758 |
| 7,253,075 B2 * | 8/2007 | Hieda | ...... | 438/393 |
| 7,348,623 B2 * | 3/2008 | Akiyama | ...... | 257/303 |
| 7,462,898 B2 * | 12/2008 | Ozaki | ...... | 257/295 |
| 7,518,173 B2 * | 4/2009 | Hikosaka et al. | ...... | 257/295 |
| 7,633,107 B2 * | 12/2009 | Matsuura | ...... | 257/295 |
| 7,755,125 B2 * | 7/2010 | Wang | ...... | 257/295 |
| 2003/0218202 A1 * | 11/2003 | Sato | ...... | 257/306 |

(Continued)

FOREIGN PATENT DOCUMENTS
JP       2006-202848       8/2006

*Primary Examiner* — Ha Tran T Nguyen
*Assistant Examiner* — Jordan Klein
(74) *Attorney, Agent, or Firm* — McGinn IP Law Group, PLLC

(57) ABSTRACT

Provided is a semiconductor device including a MIM capacitor, and having excellent waterproof property and antioxidant property even when being formed between wiring layers. The semiconductor device includes a semiconductor substrate, a first insulating film formed on the semiconductor substrate, a first wiring layer embedded in the first insulating film, a wiring cap film for covering the first wiring layer, the MIM capacitor formed on the wiring cap film, a hydrogen barrier film for covering the MIM capacitor, a second insulating film formed on the hydrogen barrier film, conductive plugs passing through the second insulating film and the hydrogen barrier film, one of which being connected to an upper electrode of the MIM capacitor and the other of which being connected to a lower electrode of the MIM capacitor, and a second wiring layer connected to the conductive plugs, and the upper and lower electrodes of the MIM capacitor.

20 Claims, 3 Drawing Sheets

U.S. PATENT DOCUMENTS

2005/0082589 A1* 4/2005 Noda et al. .................... 257/300
2006/0138515 A1* 6/2006 Ozaki .......................... 257/306
2006/0157762 A1 7/2006 Hikosaka et al.
2007/0045702 A1* 3/2007 Liang ........................... 257/306
2009/0200638 A1* 8/2009 Smith ........................... 257/532

* cited by examiner

SEMICONDUCTOR DEVICE INCLUDING HYDROGEN BARRIER FILM FOR COVERING METAL-INSULATOR-MEAL CAPACITOR AND METHOD OF MANUFACTURING THE SAME

BACKGROUND OF THE INVENTION

1. Field of the Invention

The present invention relates to a semiconductor device, and more particularly, to a semiconductor device including a metal-insulator-metal (MIM) capacitor and a method of manufacturing the semiconductor device.

2. Description of the Related Art

In recent years, lowering of a dielectric constant (attaining of low-k) of a wiring interlayer insulating film has been advanced. It is anticipated that low-k films will be used for almost all wiring layers in the future. However, in general, the low-k films have high porous property, and in proportion to that, have high hygroscopicity. Such properties described above become more apparent in ultra low-k films having a specific dielectric constant value "k" which falls below 2.5. When a MIM capacitor is mounted between interlayer insulating films, concerns about influence of moisture which has been absorbed in the interlayer insulating films are raised. The influence of moisture may cause problems such as reliability degradation in dielectric films, deterioration in polarization characteristics, and oxidation of electrode materials.

JP 2006-202848 A discloses the structure including a ferroelectric capacitor which is formed in the same layer together with a contact layer or a MOS transistor layer provided on a semiconductor substrate. In the structure described above, the ferroelectric capacitor is formed on an antioxidant film and a hydrogen barrier metal film is formed so as to cover the ferroelectric capacitor.

When the MIM capacitor is formed in the contact layer or the MOS transistor layer below a wiring layer, the antioxidant film and an alumina film with moisture resistance are required to be separately formed immediately below the MIM capacitor in the conventional technology. Further, compared with the process of manufacturing a semiconductor device which is not provided with the MIM capacitor, the process in this case causes a larger height difference between contacts, and hence it is difficult to control dimension and size of the contacts. In the structure shown in JP 2006-202848 A, a step between an upper electrode and a lower electrode is caused. Therefore, in a case where an interlayer insulating film is formed by chemical vapor deposition (CVD) or the like, this step portion may lead to degradation in film quality (low density), decrease in film strength, or the like.

SUMMARY OF THE INVENTION

The present invention has been made in view of the circumstances described above, and an object thereof is to provide a semiconductor device including a metal-insulator-metal (MIM) capacitor and having excellent waterproof property and antioxidant property even when the semiconductor device is formed between wiring layers.

According to the present invention, there is provided a semiconductor device including: a semiconductor substrate; a first insulating film formed on the semiconductor substrate; a first wiring layer embedded in the first insulating film; a wiring cap film for covering the first wiring layer; a metal-insulator-metal capacitor formed on the wiring cap film; a hydrogen barrier film for covering the metal-insulator-metal capacitor; a second insulating film formed on the hydrogen barrier film; conductive plugs passing through the second insulating film and the hydrogen barrier film, one of the conductive plugs being connected to an upper electrode of the metal-insulator-metal capacitor and another one of the conductive plugs being connected to a lower electrode of the metal-insulator-metal capacitor; and a second wiring layer connected to the conductive plugs, the upper electrode of the metal-insulator-metal capacitor, and the lower electrode of the metal-insulator-metal capacitor.

According to the present invention, the structure in which the wiring cap film and the hydrogen barrier film cover the MIM capacitor is achieved, and therefore the semiconductor device less affected by moisture is provided. In other words, the wiring cap film having a role in wiring protection has another role in imparting the waterproof property and the antioxidant property to the MIM capacitor. Accordingly, the simple structure can lead to reduction in influence of moisture on the MIM capacitor.

Further, according to the present invention, there is provided a method of manufacturing a semiconductor device, including: forming a first insulating film on a semiconductor substrate to form a groove on the first insulating film; covering the groove with a wiring material to form a first wiring layer; forming a wiring cap film on the first insulating film and the first wiring layer; forming, on the wiring cap film, a lower electrode layer, a dielectric film, an upper electrode layer, and a hard mask layer, which form a metal-insulator-metal capacitor; forming the metal-insulator-metal capacitor including the lower electrode layer, the dielectric film, the upper electrode layer, and the hard mask layer by selectively etching; forming a hydrogen barrier film for covering the metal-insulator-metal capacitor; forming a second insulating film to cover the hydrogen barrier film; forming conductive plugs passing through the second insulating film and the hydrogen barrier film, one of the conductive plugs being connected to the upper electrode layer and another one of the conductive plugs being connected to the lower electrode layer; and forming a second wiring layer connected to the conductive plugs, the upper electrode layer, and the lower electrode layer.

According to the present invention, the film-forming process for the antioxidant film, a moisture resistant film, or the like need not to be separately provided in order to impart the waterproof property and the antioxidant property to the MIM capacitor. In other words, the wiring cap film for protecting the wiring layer can also be used as a protective film of the MIM capacitor, which can simplify the processes.

Still further, according to the present invention, there is provided a semiconductor device including: wiring formed on a substrate; a wiring cap film for covering the wiring; a metal-insulator-metal capacitor formed on the wiring cap film and including an upper electrode and a lower electrode; conductive plugs for imparting a potential to the upper electrode and the lower electrode from above the metal-insulator-metal capacitor; and a hydrogen barrier film provided on one of the metal-insulator-metal capacitor and the wiring cap film, and formed to cover a region excluding a bottom portion of the metal-insulator-metal capacitor and a region in which the conductive plugs are formed.

According to the present invention, the semiconductor device including the MIM capacitor less affected by moisture which has been absorbed in the interlayer dielectric films is provided. The MIM capacitor in the semiconductor device according to the present invention has the excellent waterproof property and antioxidant property even when formed between the interlayer dielectric films. Accordingly, degradation in reliability of dielectric films, deterioration in polarization characteristics, and oxidation of electrode materials, which are caused by moisture, can be suppressed.

DETAILED DESCRIPTION OF THE PREFERRED EMBODIMENTS

Figure 1:
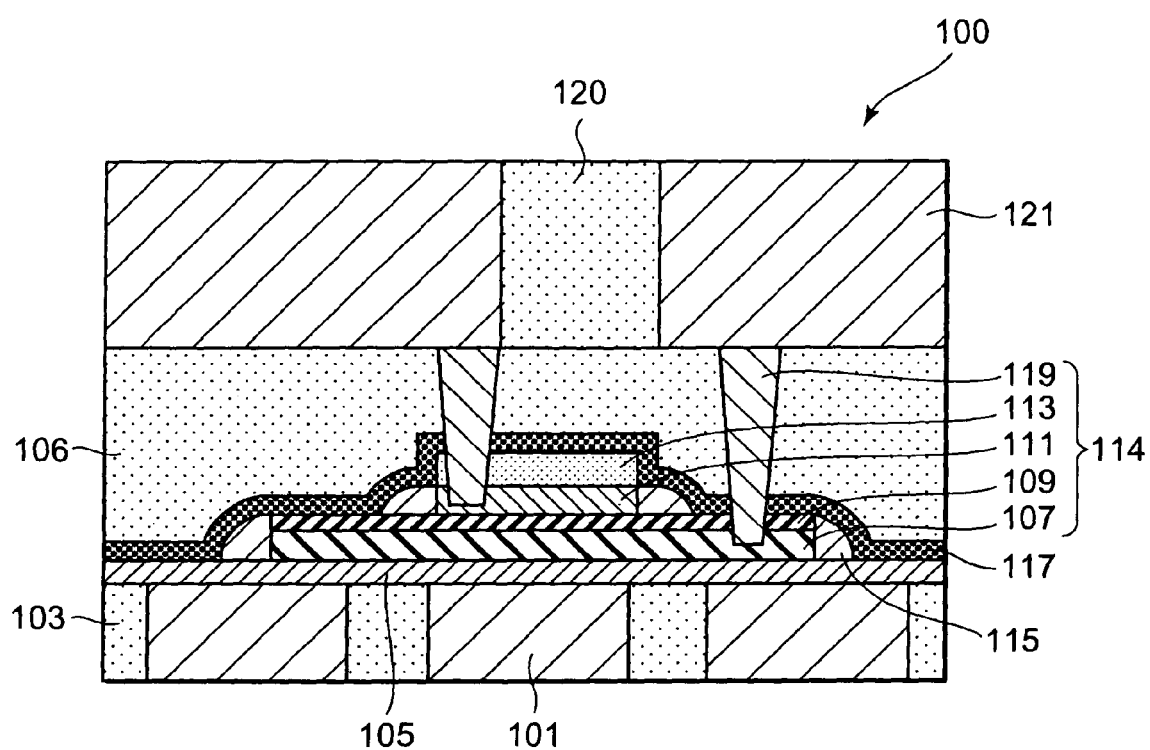
FIG. 1 is a sectional view schematically showing a semiconductor device according to a first embodiment of the present invention.

Hereinafter, embodiments of the present invention are described with reference to the drawings. Note that like constituents are denoted by like reference numerals in all of the drawings, and description thereof are omitted. Further, materials expressed by chemical formulae are assumed to have arbitrary composition ratios.

First Embodiment

FIG. 1 shows an example of a semiconductor device including a metal-insulator-metal (MIM) capacitor according to this embodiment.

The semiconductor device according to this embodiment includes, as shown in FIG. 1, a semiconductor substrate (not shown), a first insulating film 103 formed on the semiconductor substrate, a first wiring layer 101 embedded in the first insulating film 103, a wiring cap film 105 for covering the first wiring layer 101, a MIM capacitor 114 formed on the wiring cap film 105, a hydrogen barrier film 117 for covering the MIM capacitor 114, a second insulating film 106 formed on the hydrogen barrier film 117, conductive plugs 119 passing through the second insulating film 106 and the hydrogen barrier film 117, one of the conductive plugs 119 being connected to an upper electrode 111 of the MIM capacitor 114 and the other thereof being connected to a lower electrode 107 of the MIM capacitor 114, and a second wiring layer 121 connected to the conductive plugs 119, and the upper electrode 111 and the lower electrode 107 of the MIM capacitor 114.

The MIM capacitor 114 according to this embodiment has the parallel plate MIM structure in which, for example, the lower electrode 107, a dielectric film 109, the upper electrode 111, and a hard mask 113 are laminated in the stated order.

As materials of the lower electrode 107 and the upper electrode 111, for example, there may be used at least one metal selected from the group consisting of Al, Ti, Zr, Ru, Ta, W, and the like, at least one conductive metal nitride selected from the group consisting of TiN, ZrN, TaN, WN, and the like, or their combination.

As the dielectric film 109, for example, there may be used a ferroelectric material, a silicon compound such as $SiO_2$ or SixNy, high dielectric constant metal oxide such as TiO, ZrO, TaO, or HfO, or perovskite dielectric such as BaTiO or SrTiO.

The hard mask 113 functions as an etch stopper when the upper electrode 111 is patterned and thereafter via holes for the conductive plugs 119 are formed. For materials of the hard mask 113, for example, there may be used $SiO_2$ used for a wiring interlayer film, or SixNy having an etch rate which is greatly different from that of a porous film, a low dielectric constant film, or the like.

The wiring cap film 105 is provided to prevent stress migration or the like of wiring, and to protect the wiring layer. The wiring cap film 105 is formed so as to cover the wiring.

The hydrogen barrier film 117 is provided so as to cover the MIM capacitor 114. In other words, the hydrogen barrier film 117 is provided on the MIM capacitor 114 or the wiring cap film 105, and is formed so as to cover a region excluding a bottom portion of the MIM capacitor 114 and a region in which the conductive plugs 119 are formed.

Materials constructing the wiring cap film 105 and the hydrogen barrier film 117 include, for example, at least one selected from the group consisting of, for example, SiN, SiCN, SiON, and SiC.

In this embodiment, materials which can be used for the first and second insulating films and the like as interlayer dielectric films are not limited in particular. However, for example, the materials include at least one selected from the group consisting of $SiO_2$, SiOC, porous SiOC, SiOF, or SiOCH, SiON; poly hydrogen siloxane such as ladder-type hydrogen silsesquioxane, hydrogen silsesquioxane (HSQ), methyl silsesquioxane (MSQ), or methyl hydrogen silsesquioxane (MHSQ); divinyl-siloxane-bis-benzocyclobutene (BCB); and aromatic compound-containing organic materials such as SiLK (trademark), porus-SiLK, and the like.

In this embodiment, materials (low-k films) obtained by lowering the dielectric constant may be used as the interlayer dielectric film. Further, in this embodiment, the interlayer dielectric film is, for example, a porous film. When the low-k film is used as the interlayer dielectric film, effects of the present invention can be obtained particularly. The low dielectric constant insulating materials include the HSQ, the MSQ, the aromatic compound-containing organic materials, and the like which have the dielectric constant equal to or smaller than 3.3. Further, in order to lower the dielectric constant, porous materials and the like in which fine vacancies (pores) are formed in a film made of the above-mentioned materials may be used. In this embodiment, the influence of moisture which has been absorbed in the interlayer dielectric film can be suppressed. Accordingly, even when a low-k film having high hygroscopicity is used, reliability degradation or the like of the dielectric film is suppressed.

In conventional technologies, a capacitor is formed in a layer adjacent to a cell transistor diffusion region, and hence a waterproof film needs to be separately formed under the capacitor. On the other hand, the MIM capacitor 114 of this embodiment is provided between the wiring layers, that is, between the first wiring layer 101 and the second wiring layer 121. In this embodiment, the MIM capacitor 114 is covered by the wiring cap film 105 and the hydrogen barrier film 117, and hence the MIM capacitor 114 of this embodiment is excellent in the waterproof property and antioxidant property. In this embodiment, the wiring cap film 105 provided on the wiring has another role in reducing the influence of moisture or the like on the MIM capacitor 114. Further, the wiring cap film 105 provided for the purpose of wiring protection can be used, with the result that an antioxidant film on a lower wiring side does not have to be separately formed. Accordingly, the simple structure can lead to reduction in influence of moisture on the MIM capacitor.

The semiconductor device according to this embodiment includes the conductive plugs 119 passing through the second insulating film 106 and the hydrogen barrier film 117, one of the conductive plugs 119 being connected to the upper electrode 111 of the MIM capacitor 114 and the other thereof being connected to the lower electrode 107 of the MIM capacitor 114. The conductive plugs 119 impart a potential to the upper electrode 111 and the lower electrode 107 of the MIM capacitor 114 from above the MIM capacitor 114.

Further, in this embodiment, there may be provided a side wall 115 in a periphery of at least one of the upper electrode 111, the dielectric film 109, and the lower electrode 107. The side wall 115 can function as a protective film of the MIM capacitor 114. In a case where a deposition technique such as CVD is used as a formation technique of the wiring interlayer films, there is concern that degradation of interlayer density (film quality) or decrease in film strength is caused at an end of the upper electrode 111 and an end of the lower electrode 107. The protective film produces effects of suppressing the degradation and decrease. Further, through the provision of the side walls 115 at both ends of each of the electrodes included in the MIM capacitor 114, the influence of moisture can be decreased more. In addition, through the provision of the side walls 115, effects of reducing steps of a region covered by the hydrogen barrier film 117 can also be anticipated. In other words, for example, the provision of the side wall 115 can reduce the inclination extending from the upper electrode 111 to the lower electrode 107, and then reduce the inclination of the hydrogen barrier film 117 covering the region described above. The side wall 115 may be provided to side surfaces of at least one of the upper electrode 111 and the lower electrode 107. Further, for example, the side wall 115 is a hydrogen barrier film such as $SiO_2$.

Further, an example of a method of manufacturing a semiconductor device 100 shown in FIG. 1 is described with reference to FIGS. 2A to 2E and 3A to 3E.

First, the first insulating film 103 is formed on the semiconductor substrate, and grooves are formed in the first insulating film 103. The grooves are covered with a wiring material to form the first wiring layer 101. In this embodiment, for example, the wiring material is copper (Cu). After the formation of the first wiring layer 101, the wiring cap film 105 such as SiCN is formed. For example, the thickness of the wiring cap film 105 is 100 nm. After the wiring cap film 105 is formed, the lower electrode 107, the dielectric film 109, the upper electrode 111, and the hard mask 113, which form the MIM capacitor, are formed in the stated order by CVD or sputtering (FIG. 2A) Here, as to the thickness of the respective films, for example, the lower electrode 107 has 100 nm, the dielectric film 109 has 20 nm, the upper electrode 111 has 100 nm, and the hard mask 113 has 100 nm.

Figure 2A:
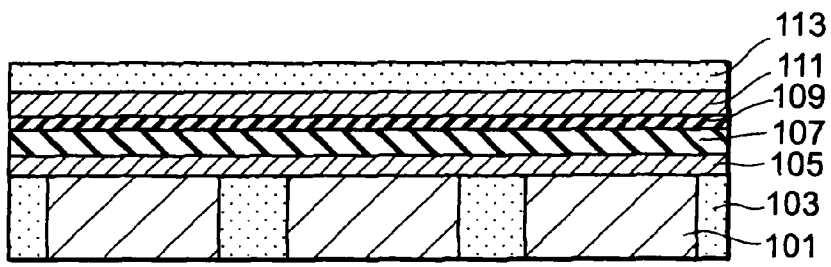
FIGS. 2A to 2E are process sectional views schematically showing a method of manufacturing the semiconductor device according to the first embodiment of the present invention.
Figure 2B:
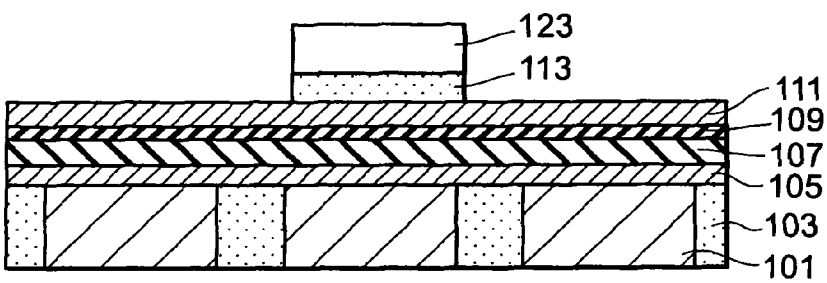
Figure 2C:
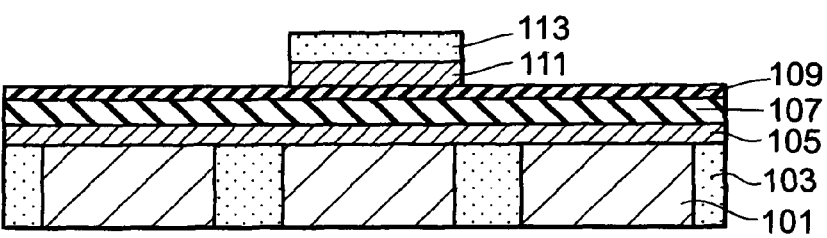

Next, a photoresist 123 is patterned by a lithography technique to obtain a desired size of the upper electrode 111. The hard mask 113 is selectively etched by dry etching (FIG. 2B). Then, the pattern of the hard mask 113 is used to selectively etch an upper electrode material and to form the upper electrode 111 (FIG. 2C).

Figure 2D:
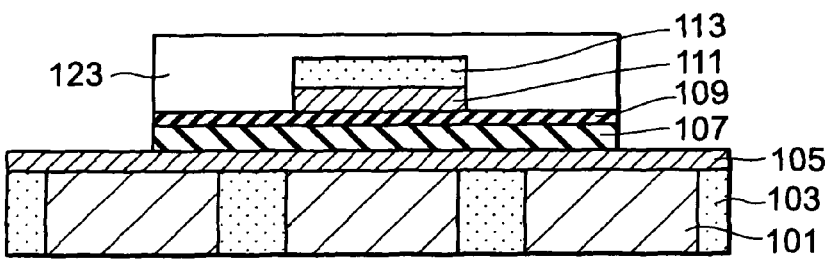
Figure 2E:
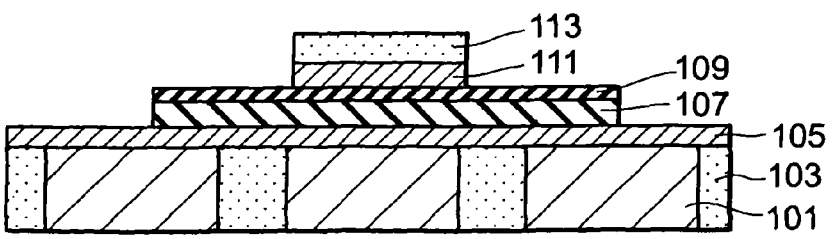

Subsequently, the photoresist 123 is patterned by the lithography technique to obtain a desired size of the lower electrode 107. The dielectric film 109 and a lower electrode material are selectively etched by dry etching to form the lower electrode 107 (FIG. 2D). After that, the photoresist 123 is removed. By the method described above, the MIM capacitor 114 including the lower electrode 107, the dielectric film 109, the upper electrode 111, and the hard mask 113 is formed on the wiring cap film 105 (FIG. 2E).

Figure 3A:
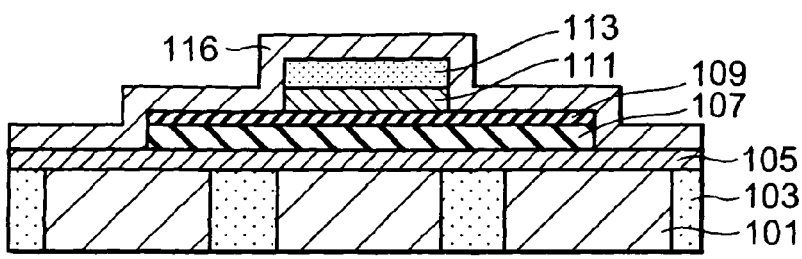
FIGS. 3A to 3E are process sectional views schematically showing the method of manufacturing the semiconductor device according to the first embodiment of the present invention.
Figure 3B:
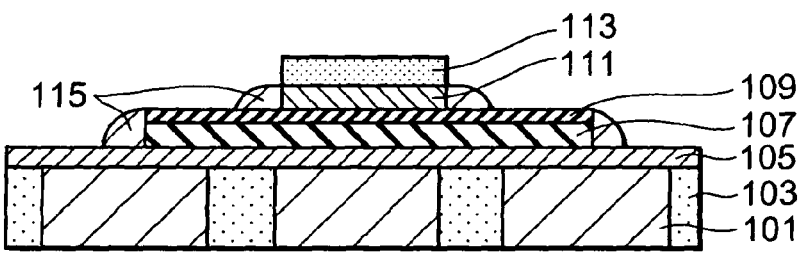

Then, as a first protective film, an $SiO_2$ film 116 is thinly deposited by CVD so as to cover the MIM capacitor 114 (FIG. 3A). The entire surface of the wafer is etched so that the $SiO_2$ film 116 is left on side surfaces of the upper electrode 111, the dielectric film 109, and the lower electrode 107. As a result, the side walls 115 including $SiO_2$ as a constituent material are formed on the side surfaces of the lower electrode 107, the dielectric film 109, and the upper electrode 111 (FIG. 3B).

Figure 3C:
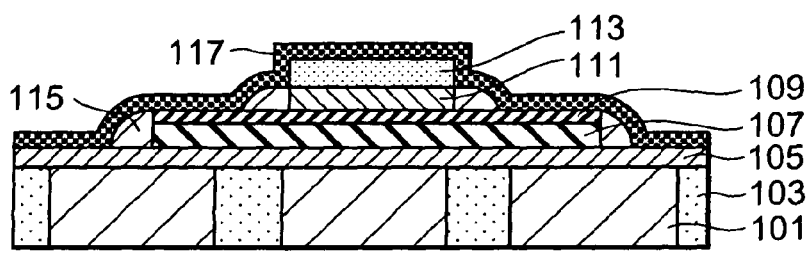

Next, as a second protective film, at least one selected from the group consisting of SiN, SiCN, SiON, and SiC is film-formed by CVD or the like. The second protective film functions as the hydrogen barrier film 117 (FIG. 3C).

Figure 3D:
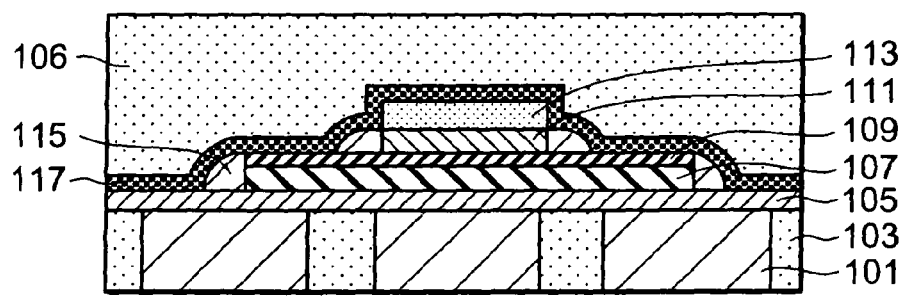

The interlayer dielectric (ILD) film serving as the second insulating film 106 is deposited by application system or CVD. Through the deposition, the second insulating film 106 covering the MIM capacitor 114 is formed. Then, the second insulating film 106 is planarized by chemical mechanical polishing (CMP) (FIG. 3D). Through the method, the height difference of the interlayer films, which is generated in the film formation, can be suppressed between an area including the MIM capacitor 114 and an area without the MIM capacitor 114.

Figure 3E:
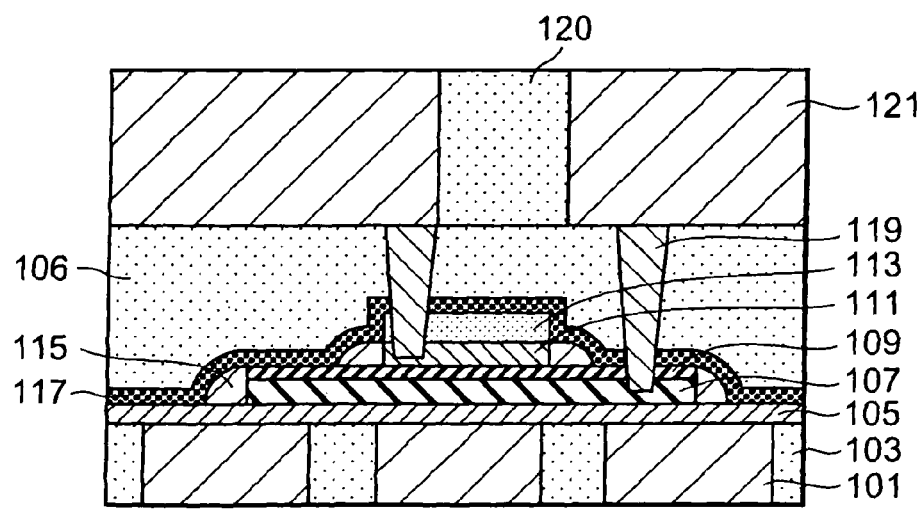

The conductive plugs 119 connected to the upper electrode 111, the lower electrode 107, and the second wiring layer 121 are simultaneously formed by lithography and dry etching. Specifically, first, a third insulating film 120 is deposited on the second insulating film 106. There are formed via holes passing through the third insulating film 120, the second insulating film 106, and the hydrogen barrier film 117 and connected to each of the upper electrode 111 and the lower electrode 107, and then there are formed wiring grooves connected the via holes described above. A barrier film and a Cu seed layer are deposited by sputtering in the via holes formed in the second insulating film 106 and in the wiring grooves formed in the third insulating film 120. Then, Cu is embedded by electroplating to form the conductive plugs 119 and the second wiring layer 121 (FIG. 3E).

In this embodiment, in order to impart the waterproof property and the antioxidant property to the MIM capacitor 114, the wiring cap film 105 covering the first wiring layer 101 can be used. As a result, the formation of the films such as the antioxidant film and the alumina film with moisture resistance is not required unlike the conventional technologies. Therefore, the number of processes for manufacturing a semiconductor device can be reduced.

Second Embodiment

In the embodiment described above, the structure in which the side walls 115 are provided at the ends of each of the upper electrode 111, the dielectric film 109, and the lower electrode 107 has been described. However, the side walls 115 are not necessarily indispensable. In this embodiment, the structure of a semiconductor device without the side wall 115 is described.

In a method of forming the wiring interlayer films, in a case where a formation method by application system is used instead of the film formation method of deposition represented by CVD, the formation process of the side wall 115 may be omitted. In a case where the interlayer dielectric films are formed by the application system, film quality and film strength can be retained without formation of the side walls. Therefore, the number of the processes can be reduced.

Examples of the interlayer dielectric films formed by the application system include silicon oxide. An example of the silicon oxide is SiLK (trademark). After applied on the substrate, the silicon oxide is sintered and solidified, thereby forming the interlayer dielectric film.

As described above, the embodiments of the present invention have been described with reference to the drawings. Those embodiments are examples of the present invention, and hence various structures other than the structures described above can be adopted.

What is claimed is:

1. A semiconductor device, comprising:
   a semiconductor substrate;
   a first insulating film formed on the semiconductor substrate;
   a first wiring layer embedded in the first insulating film;
   a wiring cap film for covering the first wiring layer;
   a metal-insulator-metal capacitor formed on the wiring cap film;
   a side wall formed at a periphery of at least one of an upper electrode and a lower electrode of the metal-insulator-metal capacitor;
   a hydrogen barrier film for covering an upper surface and side surfaces of the metal-insulator-metal capacitor and the side wall;
   a second insulating film formed on the hydrogen barrier film;
   conductive plugs passing through the second insulating film and the hydrogen barrier film, one of the conductive plugs being connected to the upper electrode of the metal-insulator-metal capacitor and another one of the conductive plugs being connected to the lower electrode of the metal-insulator-metal capacitor; and
   a second wiring layer connected to the conductive plugs, the upper electrode of the metal-insulator-metal capacitor, and the lower electrode of the metal-insulator-metal capacitor,
   wherein the side wall comprises different materials from materials of the hydrogen barrier film.

2. A semiconductor device according to claim 1, wherein the second insulating film comprises a low-k film.

3. A semiconductor device according to claim 1, wherein the second insulating film comprises a porous film.

4. A semiconductor device according to claim 1, wherein the side wall comprises $SiO_2$.

5. A semiconductor device according to claim 4, wherein the side wall comprises the hydrogen barrier film.

6. A semiconductor device according to claim 1, wherein the wiring cap film and the hydrogen barrier film each comprise at least one selected from the group consisting of SiN, SiCN, SiON, and SiC.

7. The semiconductor device according to claim 1, wherein said wiring cap film is directly in contact with said hydrogen barrier film at a region excluding said metal-insulator-metal capacitor.

8. A semiconductor device according to claim 1, wherein the side wall is disposed on a side surface of the lower electrode of the metal-insulator-metal capacitor, said hydrogen barrier film abutting said side wall.

9. A semiconductor device according to claim 1, wherein said hydrogen barrier film abuts said wiring cap film.

10. A semiconductor device according to claim 1, wherein said hydrogen barrier film covers a side surface of the lower electrode of the metal-insulator-metal capacitor.

11. A semiconductor device according to claim 1, wherein, in a plan view, the first wiring layer overlaps said metal-insulator-metal capacitor.

12. A semiconductor device according to claim 1, further comprising:
    a dielectric film disposed between the upper electrode of the metal-insulator-metal capacitor and the lower electrode of the metal-insulator-metal capacitor, said hydrogen barrier film abutting an upper surface of the dielectric film.

13. A semiconductor device, comprising:
    a wiring formed on a substrate;
    a wiring cap film for covering the wiring;
    a metal-insulator-metal capacitor formed on the wiring cap film and comprising an upper electrode and a lower electrode;
    conductive plugs for imparting a potential to the upper electrode and the tower electrode from above the metal-insulator-metal capacitor;
    a hydrogen barrier film provided on one of the metal-insulator-metal capacitor and the wiring cap film, and formed to cover a region excluding a bottom portion of the metal-insulator-metal capacitor and a region in which the conductive plugs are formed; and
    a side wall for reducing inclination of the hydrogen barrier film extending from the upper electrode to the lower electrode, formed on a side surface of at least one of the upper electrode and the lower electrode, the side wall comprising different materials from materials of the hydrogen barrier film.

14. A semiconductor device according to claim 13, wherein the side wall comprises $SiO_2$.

15. The semiconductor device according to claim 13, wherein said wiring cap film touches said hydrogen barrier film at a region excluding said bottom portion.

16. A semiconductor device according to claim 13, wherein the side wall is disposed on the side surface of the lower electrode of the metal-insulator-metal capacitor, said hydrogen barrier film abutting said side wall.

17. A semiconductor device according to claim 13, wherein said hydrogen barrier film abuts said wiring cap film.

18. A semiconductor device according to claim 13, wherein said hydrogen barrier film covers the side surface of the lower electrode of the metal-insulator-metal capacitor.

19. A semiconductor device according to claim 13, wherein, in a plan view, the wiring overlaps said metal-insulator-metal capacitor.

20. A semiconductor device according to claim 13, further comprising:
    a dielectric film disposed between the upper electrode of the metal-insulator-metal capacitor and the lower electrode of the metal-insulator-metal capacitor, said hydrogen barrier film abutting an upper surface of the dielectric film.

* * * * *

UNITED STATES PATENT AND TRADEMARK OFFICE
CERTIFICATE OF CORRECTION

PATENT NO. : 8,237,208 B2  Page 1 of 1
APPLICATION NO. : 12/289824
DATED : August 7, 2012
INVENTOR(S) : Takayuki Iwaki It is certified that error appears in the above-identified patent and that said Letters Patent is hereby corrected as shown below:

Title Page Item : 54 and Col. 1, Line 3, in the title, replace "MEAL" with "METAL".

Signed and Sealed this
Twenty-third Day of October, 2012

David J. Kappos
*Director of the United States Patent and Trademark Office*